(12) United States Patent
Kawade et al.

(10) Patent No.: US 7,723,620 B2
(45) Date of Patent: May 25, 2010

(54) LEAD PIN FOR MOUNTING SEMICONDUCTOR AND PRINTED WIRING BOARD

(75) Inventors: Masanori Kawade, Obu (JP); Hiroyuki Tsuruga, Ogaki (JP); Makoto Ebina, Obu (JP)

(73) Assignees: IBIDEN Co., Ltd., Ogaki-shi (JP); TIBC Co., Ltd., Obu-shi (JP)

( * ) Notice: Subject to any disclaimer, the term of this patent is extended or adjusted under 35 U.S.C. 154(b) by 633 days.

(21) Appl. No.: 11/572,334

(22) PCT Filed: Aug. 30, 2005

(86) PCT No.: PCT/JP2005/015771

§ 371 (c)(1),
(2), (4) Date: Jan. 19, 2007

(87) PCT Pub. No.: WO2006/030634

PCT Pub. Date: Mar. 23, 2006

(65) Prior Publication Data

US 2008/0055874 A1 Mar. 6, 2008

(30) Foreign Application Priority Data

Sep. 15, 2004 (JP) .............................. 2004-268521

(51) Int. Cl.
H01R 12/04 (2006.01)
H05K 1/11 (2006.01)

(52) U.S. Cl. ...................................... 174/267; 257/780

(58) Field of Classification Search ................. 174/267; 361/803; 29/842–845; 257/780–781
See application file for complete search history.

(56) References Cited

U.S. PATENT DOCUMENTS

| 6,011,222 | A | * | 1/2000 | Sekiya et al. | ................ 174/266 |
| 6,049,039 | A | * | 4/2000 | Fushimi | ..................... 174/68.1 |
| 6,229,207 | B1 | | 5/2001 | Master | |
| 6,623,283 | B1 | | 9/2003 | Torigian et al. | |
| 2001/0015491 | A1 | | 8/2001 | Shiraishi | |

FOREIGN PATENT DOCUMENTS

| JP | 60-106375 | 7/1985 |
| JP | 63-157457 | 6/1988 |

(Continued)

OTHER PUBLICATIONS

Machine Translation of JP 2001-291815 (Oct. 19, 2001).*

(Continued)

*Primary Examiner*—Jeremy C Norris
(74) *Attorney, Agent, or Firm*—Oblon, Spivak, McClelland, Maier & Neustadt, L.L.P.

(57) ABSTRACT

A semiconductor loading lead pin that does not tilt at a time of reflow. A void is sometimes left in solder between an electrode pad and the flange of a semiconductor loading lead pin. When reflow is carried out to load an IC chip, the solder for connection is melted and at the same time, the void in the solder is expanded. The solder escapes sideway along the groove portion, and thereby a flange is not raised by the void so that the semiconductor loading lead pin is not tilted.

18 Claims, 11 Drawing Sheets

FOREIGN PATENT DOCUMENTS

| | | |
|---|---|---|
| JP | 64-30853 | 2/1989 |
| JP | 9-223529 | 8/1997 |
| JP | 10-35638 | 2/1998 |
| JP | 2001-267451 | 9/2001 |
| JP | 2001-291815 | 10/2001 |
| TW | 457681 | 10/2001 |
| TW | 520076 | 2/2003 |
| TW | 546806 | 8/2003 |
| TW | 563232 | 11/2003 |
| TW | 1220778 | 9/2004 |

OTHER PUBLICATIONS

Drawings from JP 2001-291815 (Oct. 19, 2001).*

* cited by examiner

Fig. 3
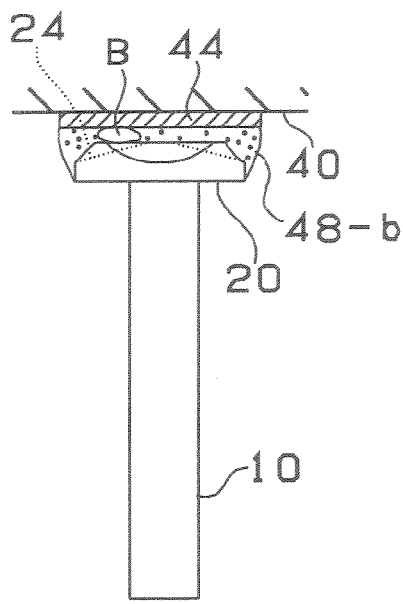
(A)
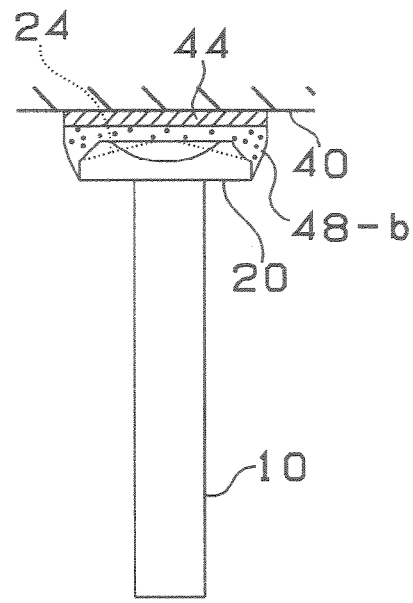
(B)
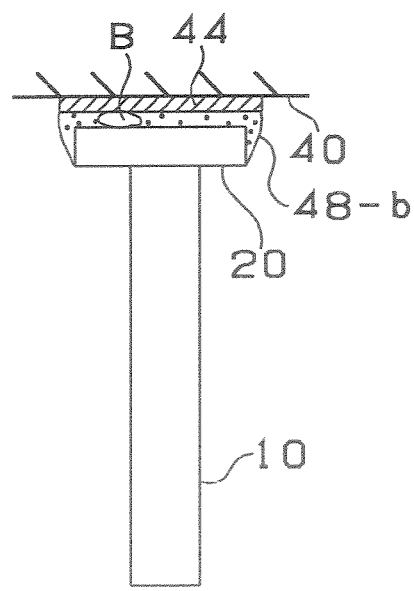
(C)
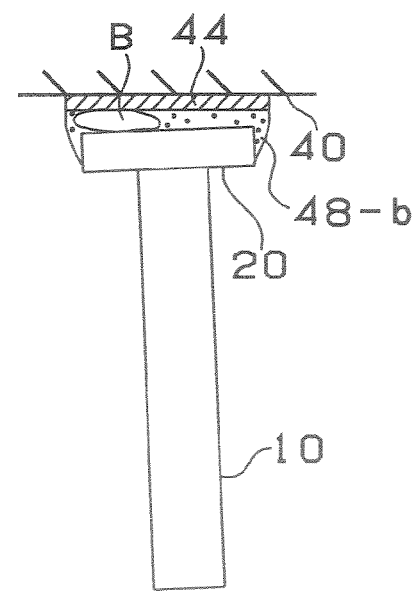
(D)

Fig. 4
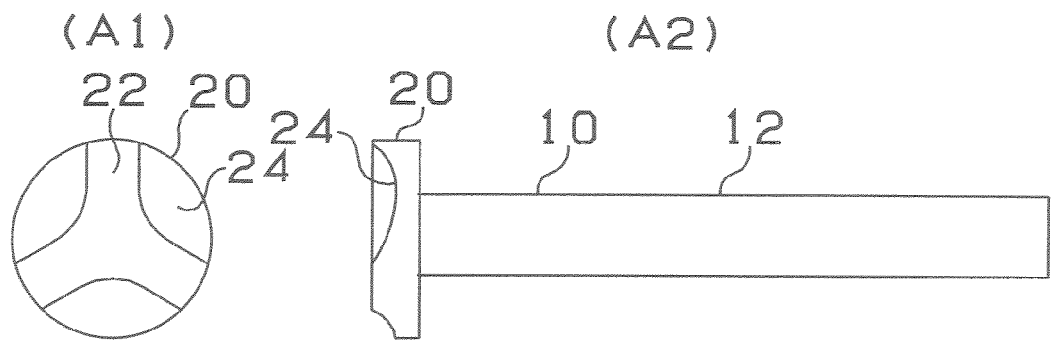
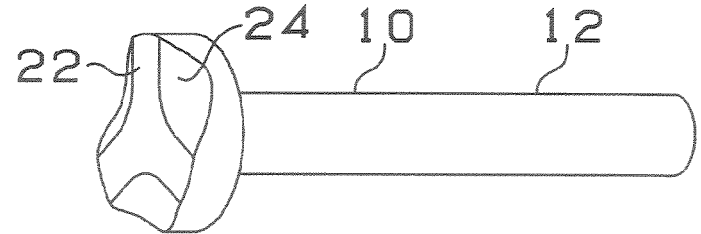
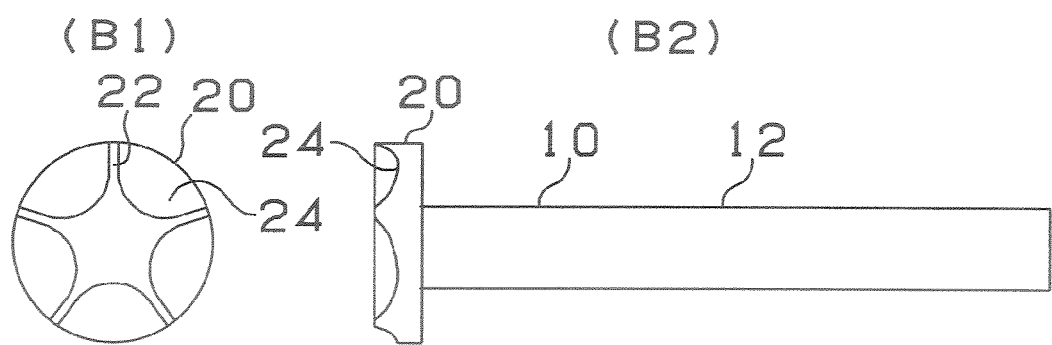
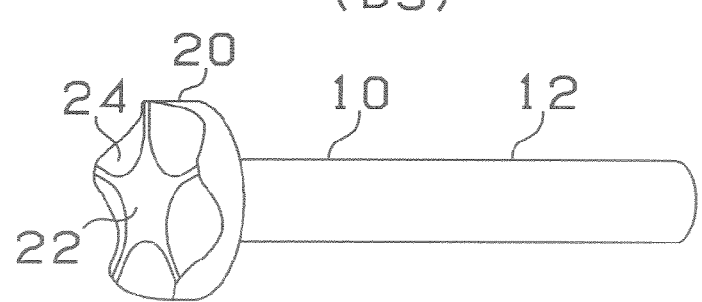

Fig. 7
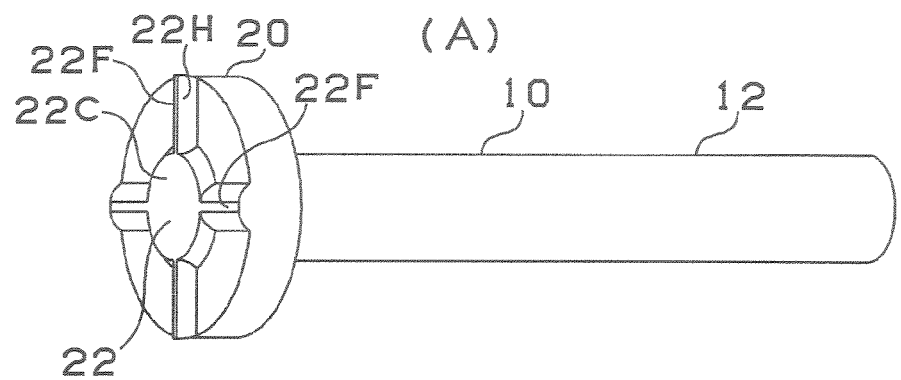
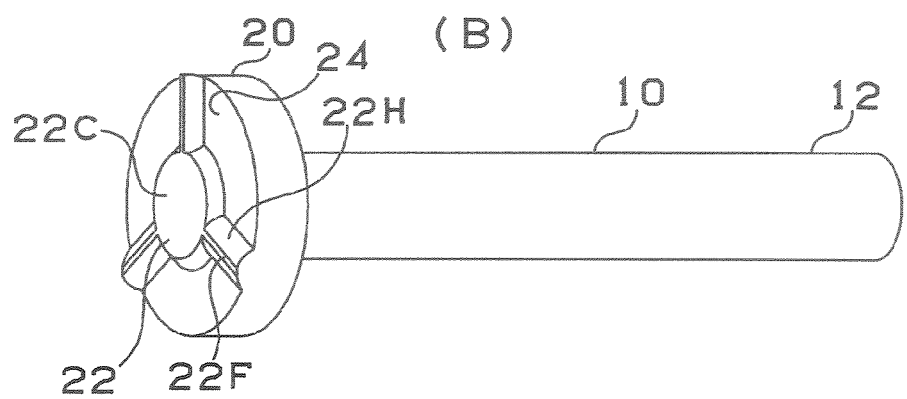
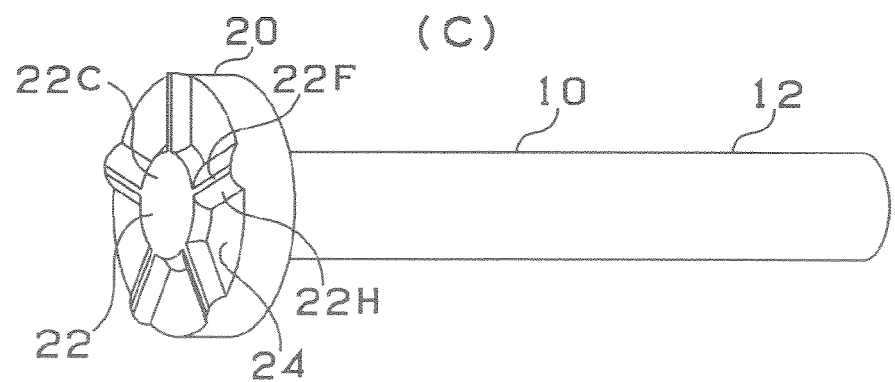

Fig. 9
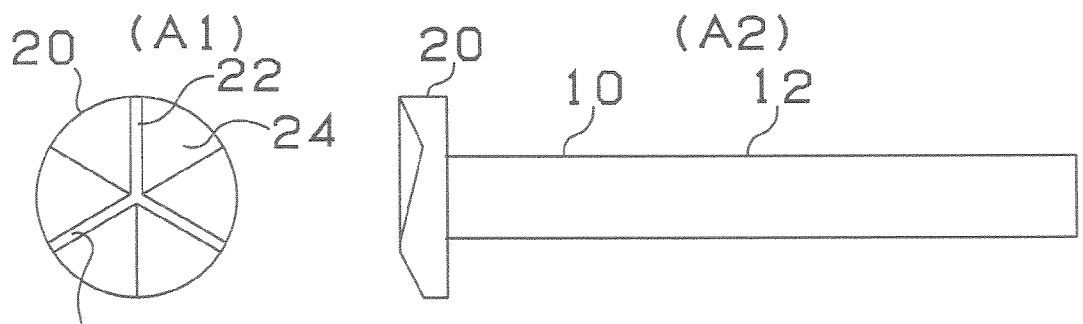
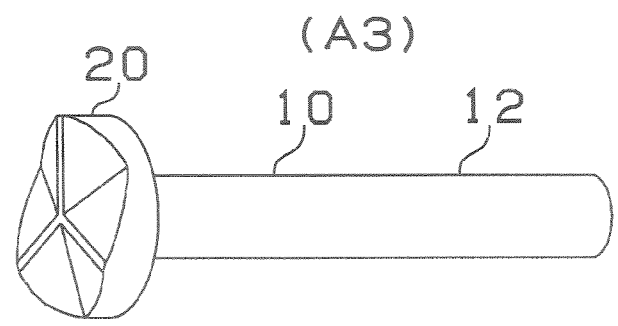
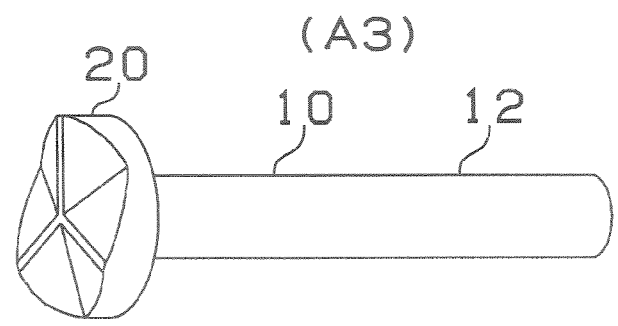
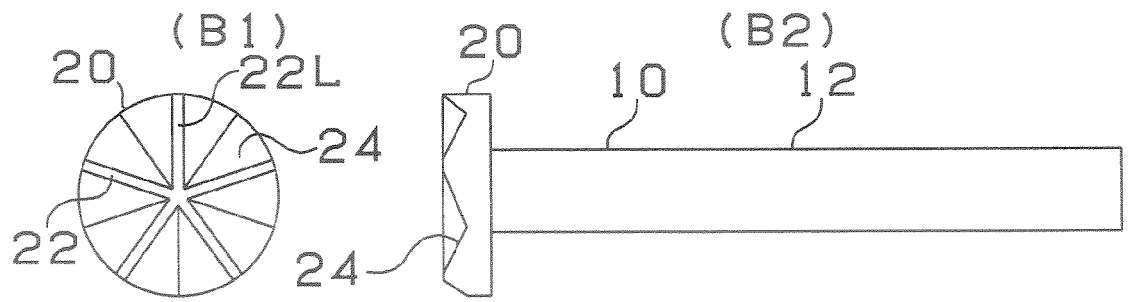
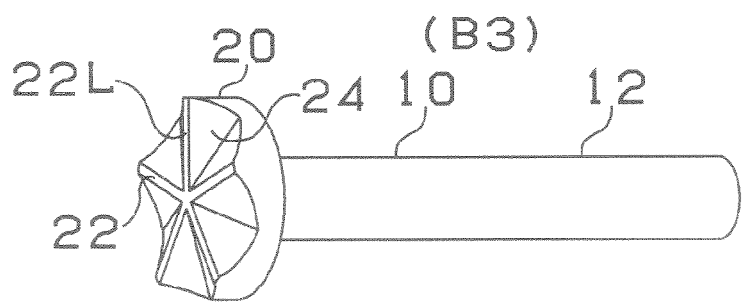
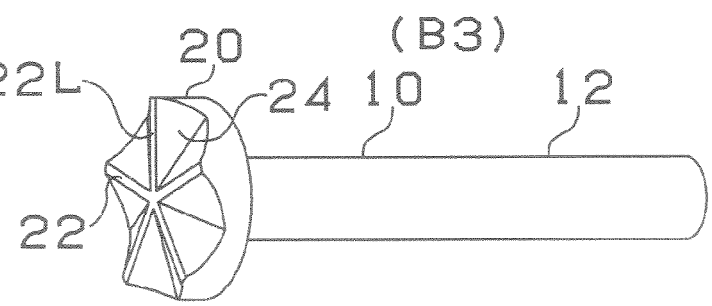

Fig. 10
(A)
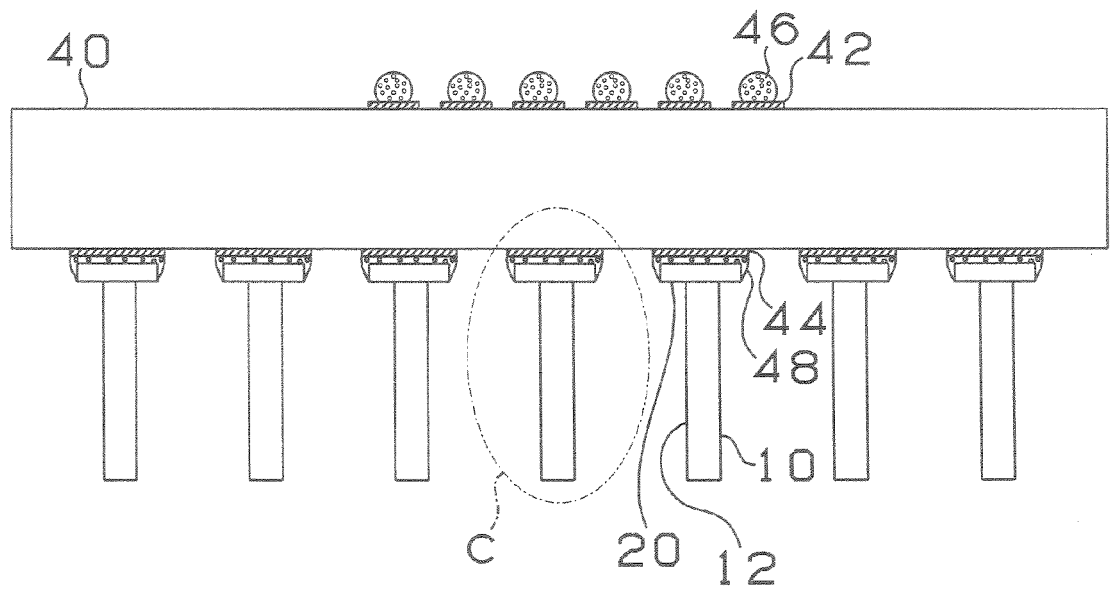
(B)
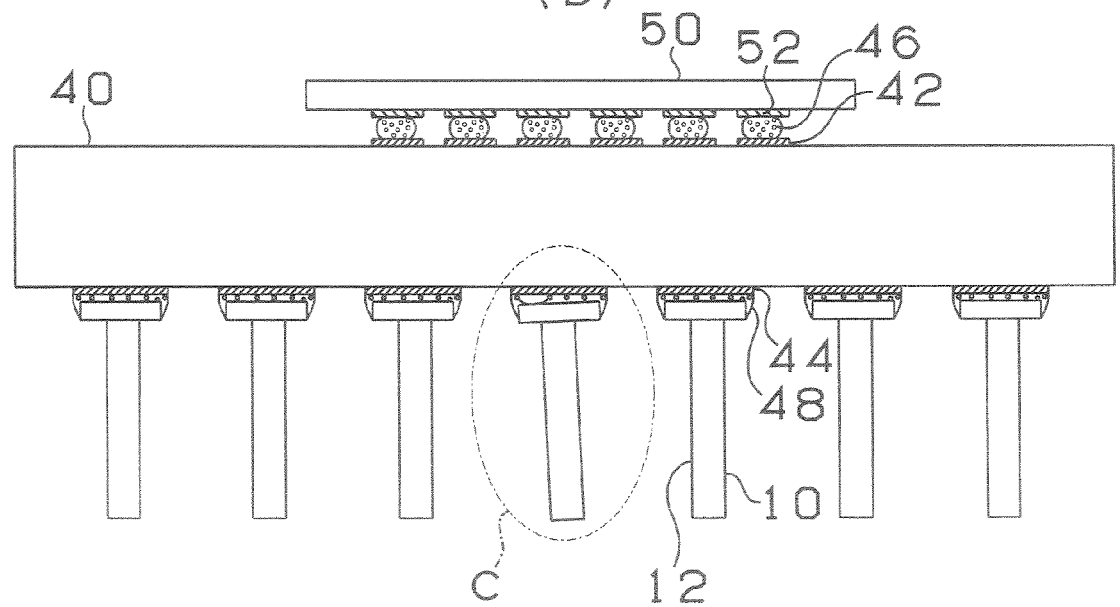

Fig. 11  PRIOR ART

Test result

|  | Remaining area of flat portion(%) | Time of over 240°C | | | |
|---|---|---|---|---|---|
|  |  | 0sec | 20sec | 40sec | 60sec |
| Pin A | 10% | 0p NG/6pcs | 0p NG/6pcs | 0p NG/6pcs | 0p NG/6pcs |
| Pin B | 20% | 0p NG/6pcs | 0p NG/6pcs | 0p NG/6pcs | 2p NG/6pcs |
| Pin C | 30% | 0p NG/6pcs | 0p NG/6pcs | 0p NG/6pcs | 2p NG/6pcs |
| Pin D | 50% | 0p NG/6pcs | 0p NG/6pcs | 1p NG/6pcs | 4p NG/6pcs |
| Current pin | 100% | 0p NG/6pcs | 4p NG/6pcs | 6p NG/6pcs | 6p NG/6pcs |

LEAD PIN FOR MOUNTING SEMICONDUCTOR AND PRINTED WIRING BOARD

TECHNICAL FIELD

The present invention relates to a semiconductor loading lead pin for use in connecting a semiconductor package with a board side socket.

BACKGROUND ART

Generally, the lead pin in a semiconductor package board of PGA (Pin Grid Array) type has been changing to the T type pin which is connected to the pad of the package board by soldering from the insertion type pin which is inserted into a through hole on the package board side in order to correspond intensified wiring density in recent years.

The T type pin is fixed to the electrode pad of a package board by soldering and likewise, the IC chip is also fixed to the electrode pad of the package board by soldering. The melting points of the solders for T pin connection and IC chip connection are made different from each other by changing the quantity of content of lead or their metallic composition so as to prevent the solder fixing the semiconductor loading lead pin from melting when the IC chip is connected by reflow.

The technology for enhancing the pull resistance of the T type pin has been disclosed in Prior Art 1.

PRIOR ART 1

JP 2001-267451 A is incorporated herein by reference.

DISCLOSURE OF THE INVENTION

Problem to be Solved by the Invention

In recent years, solder containing no lead (for example, tin-silver-copper solder, tin-antimony solder) has been used by taking consideration of influences upon the environment and the melting point of the solder has been raised. Thus, when an IC chip is loaded on a package board by melting solder bumps by reflow there has occurred such a problem that the solder for connecting the semiconductor loading lead pin is melted so that the semiconductor loading lead pin is inclined thereby disabling the IC chip from being attached to the daughter board socket. Currently, the package board for CPU is provided with several hundreds semiconductor loading lead pins and if even one of them tilts that CPU cannot be attached to the socket thereby producing a defective good.

The tilt of this semiconductor loading lead pin will be described further with reference to FIG. 10(A) FIG. 10(B) FIG. 3(C) and FIG. 3(D).

FIG. 10(A) shows a package board 40. Solder bumps 46 are formed on electrode pads 42 on the top face of the package board 40 and semiconductor loading lead pins 10 are attached to the electrode pads 44 on the bottom side through solder 48. When the IC chip 50 is loaded by melting the solder bumps 46 on the top face of the package board 40 by reflow and connecting to the electrode pads 52 of the IC chip 50, the semiconductor loading lead pin 10 is sometimes tilted.

FIG. 3(C) shows the semiconductor loading lead pin 10 in an ellipse C of FIG. 10(A), and FIG. 3(D) shows the semiconductor loading lead pin in an ellipse of FIG. 10(B). It has been made evident that when the semiconductor loading lead pin 10 is tilted as shown in FIG. 10(B), void B is left in solder 48 existing between the electrode pad 44 and the flange 20 of the semiconductor loading lead pin 10 as shown in FIG. 10(B). Then, it has been further made evident that when reflow is carried out to load the IC chip 50 the solder 48 for connection is melted as shown in FIG. 3(D) and at the same time, the void B in the solder is expanded so that the flange 20 is pushed up by that void thereby tilting the semiconductor loading lead pin 10.

The present invention has been achieved to solve the above-described problem and an object of the invention is to provide a semiconductor loading lead pin which is not tilted at the time of reflow.

Means for Solving the Problem

In order to achieve the above object, according to claim 1 is characterized in a semiconductor loading lead pin comprised of a shaft and a flange, wherein the flange is constituted of a plane-like flat portion capable of making contact with a connection pad and three or more groove portions dented from the flat portion, and the flat portion extends from the central position of the flange up to a side end and is formed symmetrically to a predetermined normal passing through the center of the shaft and the groove portion is formed to be directed toward the center side from the side end.

Effect of the Invention

In the semiconductor loading lead pin of claim 1, the flange is comprised of a plane-like flat portion which can make contact with a connection pad and three or more groove portions which are dented from the flat portion and the flat portion extends from the central position of the flange up to the side end while the groove portion is formed to be directed toward the central side from the side end. That is, because the groove portions are formed to be directed from the side end to the central side in the flange, void is left in solder between a connection pad and flange, so that even if the void is expanded at the time of reflow, it escapes sideway along the groove. As a result, it does not happen that the flange is raised by the void so that the semiconductor loading lead pin is tilted. Further, because the flat portion extends from the central position of the flange up to the side end and at the same time is formed symmetrically to a predetermined normal passing through the center of its shaft, the semiconductor loading lead pin can maintain perpendicularity to a package board.

In the semiconductor loading lead pin of claim 2, the groove portion is formed substantially semi-circularly. Because the groove portion is tilted toward the side end of the flange, the void expanded is likely to escape sideway along the groove portion at the time of reflow.

In the semiconductor loading lead pin of claim 3, the flat portion is comprised of a circular portion coaxial with the flange and an extending portion having a semi-circular section that extends from the circular portion to the side end with its top end located at the same height as the circular portion. Thus, the flat portion can be formed easily with a mold.

In the semiconductor loading lead pin of claim 4, the groove portion is formed in a V shape in its cross section. Because the groove portion is tilted toward the side end of the flange, the void expanded is likely to escape sideway along the groove portion at the time of reflow.

According to claim 5 it can be connected firmly to the connection pad by setting the area of the flat portion to 5% or more that of the section in a direction perpendicular to the shaft of the flanges. On the other hand, if the area of the flat portion is set to less than 50%, the void expanded is likely to escape sideway along the groove portion at the time of reflow.

According to claim 6, it can be connected firmly to the connection pad by setting the area of the flat portion to 10% or more that of the section in the direction perpendicular to the shaft of the flange. On the other hand, the void expanded is likely to escape sideway along the groove portion at the time of reflow.

In the printed wiring board of claim 7, it does not happen that the semiconductor loading lead pin is tilted.

BRIEF DESCRIPTION OF THE DRAWINGS

FIG. 3(A) shows a semiconductor loading lead pin 10 in an ellipse C in FIG. 2(B) and FIG. 3(B) shows a semiconductor loading lead pin 10 in an ellipse C in FIG. 2(C). FIG. 3(C) shows a semiconductor loading lead pin 10 in an ellipse C in FIG. 10(A) and FIG. 3(D) shows a semiconductor loading lead pin 10 in an ellipse C in FIG. 10(B).

FIG. 4(A1) is a plan view of a semiconductor loading lead pin according to a first modification of the first embodiment, FIG. 4(A2) is a side view thereof and FIG. 4(A3) is a perspective view thereof. FIG. 4(B1) is a plan view of the semiconductor loading lead pin according to a second modification of the first embodiment, FIG. 4(B2) is a side FIG. 5(B) is a side view thereof and FIG. 5(C) is a perspective view thereof.

FIG. 6(B1) is a plan view of the semiconductor loading lead pin according to a second modification of the second embodiment, FIG. 6 is a side view thereof and FIG. 6(B3) is a perspective view thereto.

FIG. 7(A) is a perspective view of the semiconductor loading lead pin according to a third modification of the second embodiment, FIG. 7(B) is a perspective view of the semiconductor loading lead pin according to a fourth modification and FIG. 7(C) is a perspective view of the semiconductor loading lead pin according to a sixth modification.

FIG. 9 is a plan view of the semiconductor loading lead pin according to a first modification of the third embodiment, FIG. 9(A2) is a side view thereof and FIG. 9(A3) is a perspective view thereof. FIG. 9(B1) is a plan view of the semiconductor loading lead pin according to a second modification of the third embodiment, FIG. 9(B2) is a side view thereof and FIG. 9(B3) is a perspective view thereof.

FIG. 10 is a process diagram showing a process for loading an IC chip to a package board using the semiconductor loading lead pin based on conventional technology.

FIG. 11 is a diagram showing a result of test about the ratio between the area of the flat portion and the sectional area in the direction perpendicular to the shaft of the flange.

BEST MODE FOR CARRYING OUT THE INVENTION

First Embodiment

Figure 1:
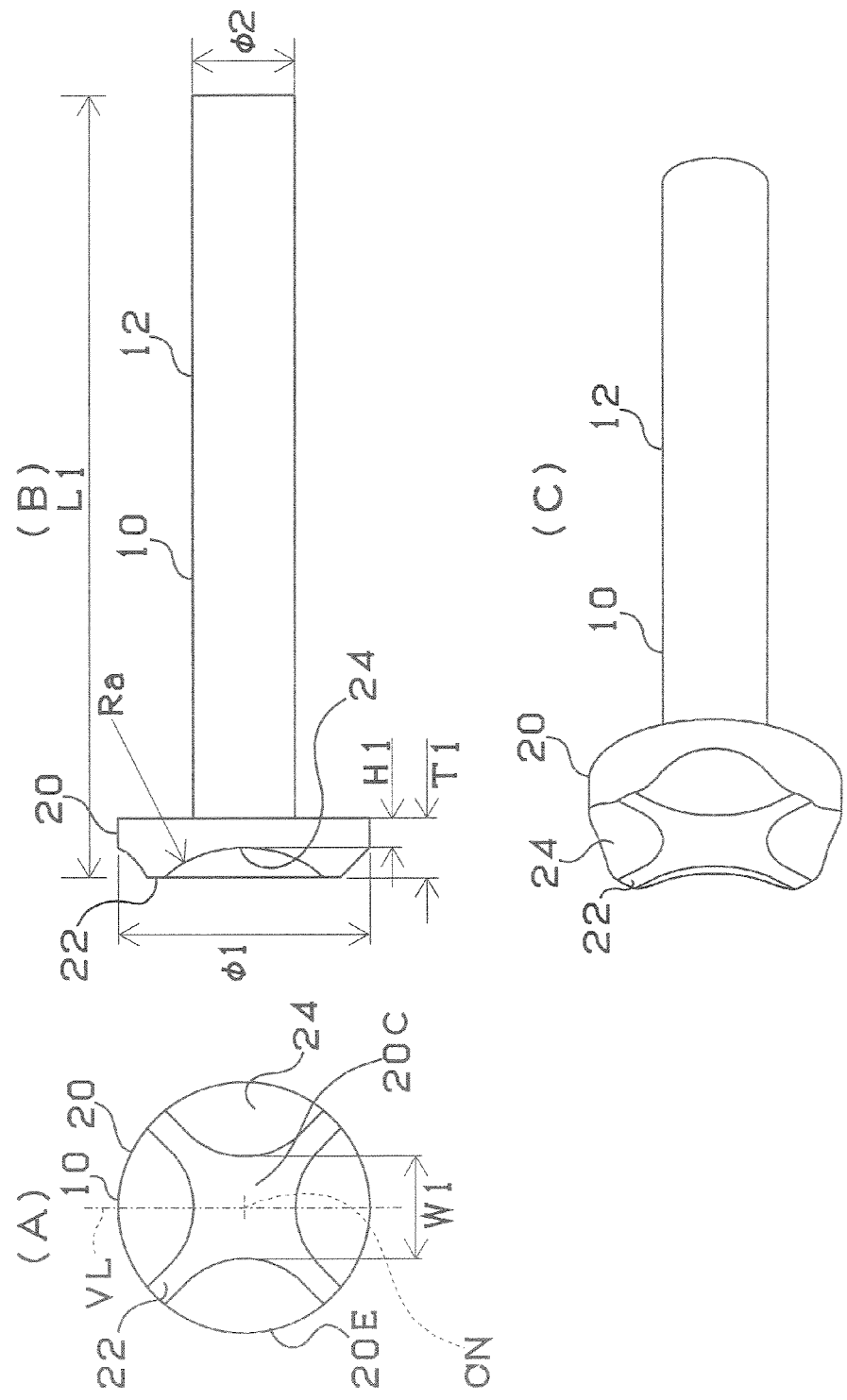
FIG. 1(A) is a plan view of a semiconductor loading lead pin according to a first embodiment of the present invention.
FIG. 1(B) is a side view thereof and FIG. 1(C) is a perspective view thereof.

Hereinafter, the semiconductor loading lead pin according to the first embodiment of the present invention will be described with reference to FIGS. 1-4.

FIG. 1(A) is a plan view of the semiconductor loading lead pin according to the first embodiment of the invention, FIG. 1(B) is a side view thereof and FIG. 1(C) is a perspective view thereof.

The semiconductor loading lead pin 10 comprises a cylindrical shaft 12 and a flange 20. The flange 20 is comprised of a plane-like flat portion 22 which can make contact with the electrode pad of a package substrate and four groove portions 24 which are dented semi-circularly from the flat portion 22. The flat portion 22 extends from the central position of the flange 20 up to a side end 20E and is formed symmetrically with respect to the normal VL passing through the center CN of the shaft 12 and the deepest portion of the groove portion 24. The groove portion 24 is formed toward the center from the side end 20E.

Here, the semiconductor loading lead pin is manufactured of copper alloy or the like in its entire length L1 of 3.16 mm The diameter Φ2 of the shaft 12 is 0.45 mm. The diameter Φ1 of the flange 20 is 1.1 mm and the thickness T1 is 0.26 mm. The groove portion 24 is formed in the depth H1 of 0.13 mm at the side end 20E which is the deepest. As shown in FIG. 1(A), the interval W1 of the opposing groove portions 24 is set to 0.45 mm.

Subsequently, installation of the semiconductor loading lead pin according to the first embodiment to a package board will be described with reference to FIGS. 2, 3.

Figure 2:
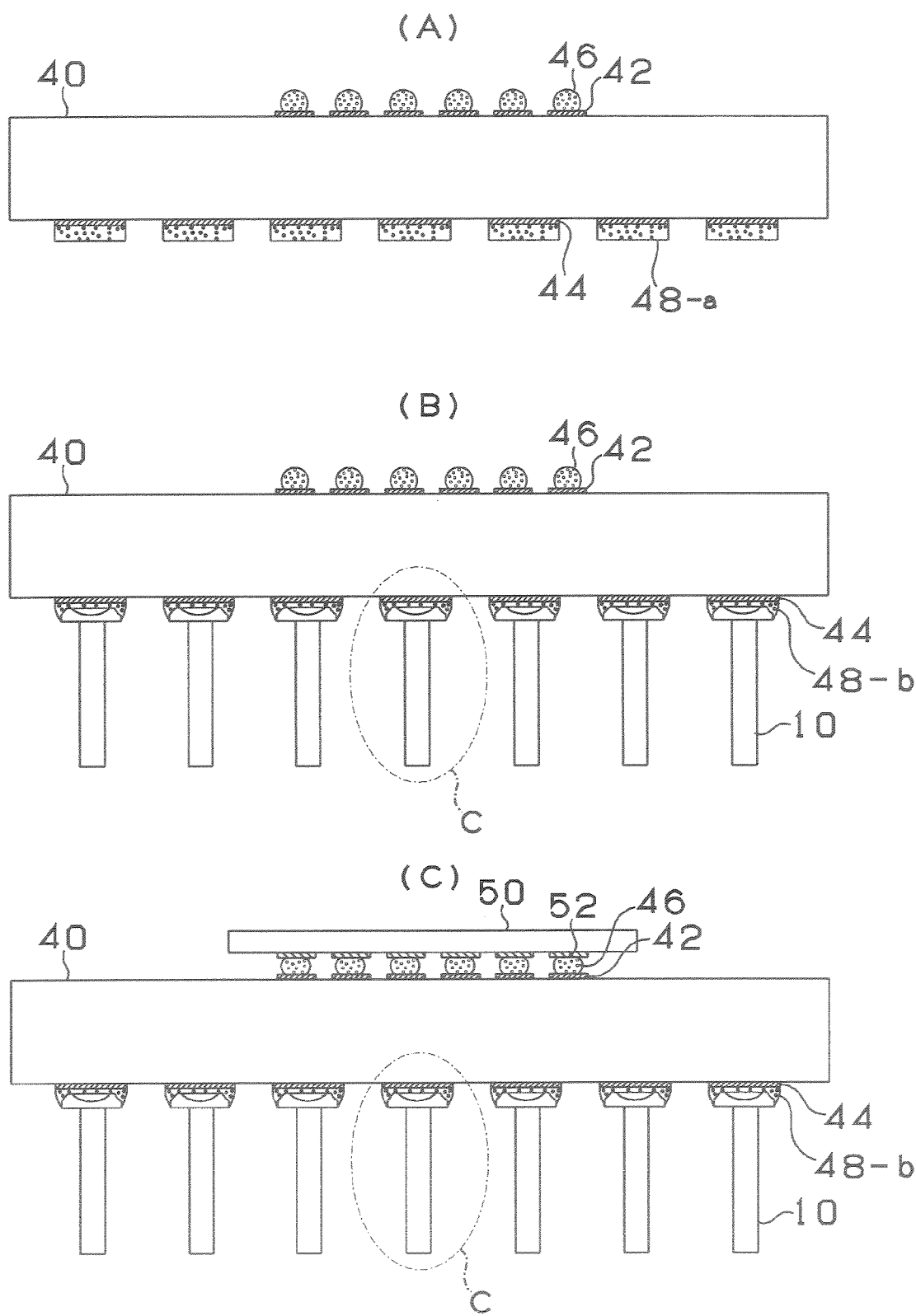
FIG. 2 is a process diagram showing processes for installation of the semiconductor loading lead pin to the package board and loading of the IC chip.

FIG. 2 is a process diagram showing installation of the semiconductor loading lead pin according to the first embodiment and loading of the IC chip. As shown in FIG. 2(A), solder bumps 46 are formed on electrode pads 42 on the top face of a package board 40 and solder pastes 48-*a* for connection are disposed on electrode pads 44 on the bottom face. Here, the semiconductor loading lead pin 10 is attached to the bottom face of the package board by melting the solder paste 48-*a* by reflow. Then, the solder bump 46 on the top face of the package board 40 is melted to be connected to the electrode pad 52 of an IC chip 50 by reflow as shown in FIG. 2(C).

FIG. 3(A) shows the semiconductor loading lead pin 10 in an ellipse C of FIG. 2(B) and FIG. 3(B) shows the semiconductor loading lead pin 10 in an ellipse C of FIG. 2(C). As shown in FIG. 3(A), void B is sometimes left in solder 48-*b* existing between the electrode pad 44 and the flange 20 of the semiconductor loading lead pin. As described above, when reflow is carried out to load the IC chip, the solder 48-*b* for connection is melted and at the same time, the void B in the solder is expanded. At this time, because the void B escapes along the groove portion 24 as shown in FIG. 3(B), it does not occur that the flange 20 is raised by the void B so that the semiconductor loading lead pin 10 is tilted.

Further, because the semiconductor loading lead pin 10 of the first embodiment is so constructed that the groove portion 24 is formed substantially semi-circularly and titled toward the side end 20E of the flange 20, the void expanded is likely to escape sideway at the time of reflow. Even if the void does not escape from the solder 48-*b*, it spreads along the groove portion 24, thereby keeping the semiconductor loading lead pin 10 from tilting.

Further because the flat portion 22 extends from the central position of the flange 20 up to the side end 20E and is formed symmetrically with respect to the normal VL passing through the center of the shaft 12, the semiconductor loading lead pin 10 can maintain its perpendicularity to the package board 40 when the solder 48 for connection is melted at the time of reflow for loading an IC chip.

By using the semiconductor loading lead pin of the first embodiment, the tilt of the semiconductor loading lead pin at the time of reflow of the IC chip can be prevented even unless a difference between the solder constituting the solder bump 46 for connecting of the IC chip and the solder 48-*b* for connecting of the semiconductor loading lead pin is increased.

FIG. 4(A1) is a plan view of the semiconductor loading lead pin according to a first modification of the first embodiment, FIG. 4(A2) is a side view thereof and FIG. 4(A3) is a perspective view thereof. FIG. 4(B1) is a plan view of the semiconductor loading lead pin according to a second modification of the first embodiment, FIG. 4(B2) is a side view thereof and FIG. 4(B3) is a perspective view thereof.

The semiconductor loading lead pin 10 of the first embodiment described with reference to FIG. 1 includes four groove portions 24 of the flange 20. Instead, three groove portions may be provided as shown in FIG. 4(A1), FIG. 4(A2) and FIG. 4(A3) or five groove portions may be provided as shown in FIG. 4(B1), FIG. 4(B2), FIG. 4(B3).

Second Embodiment

Figure 5:
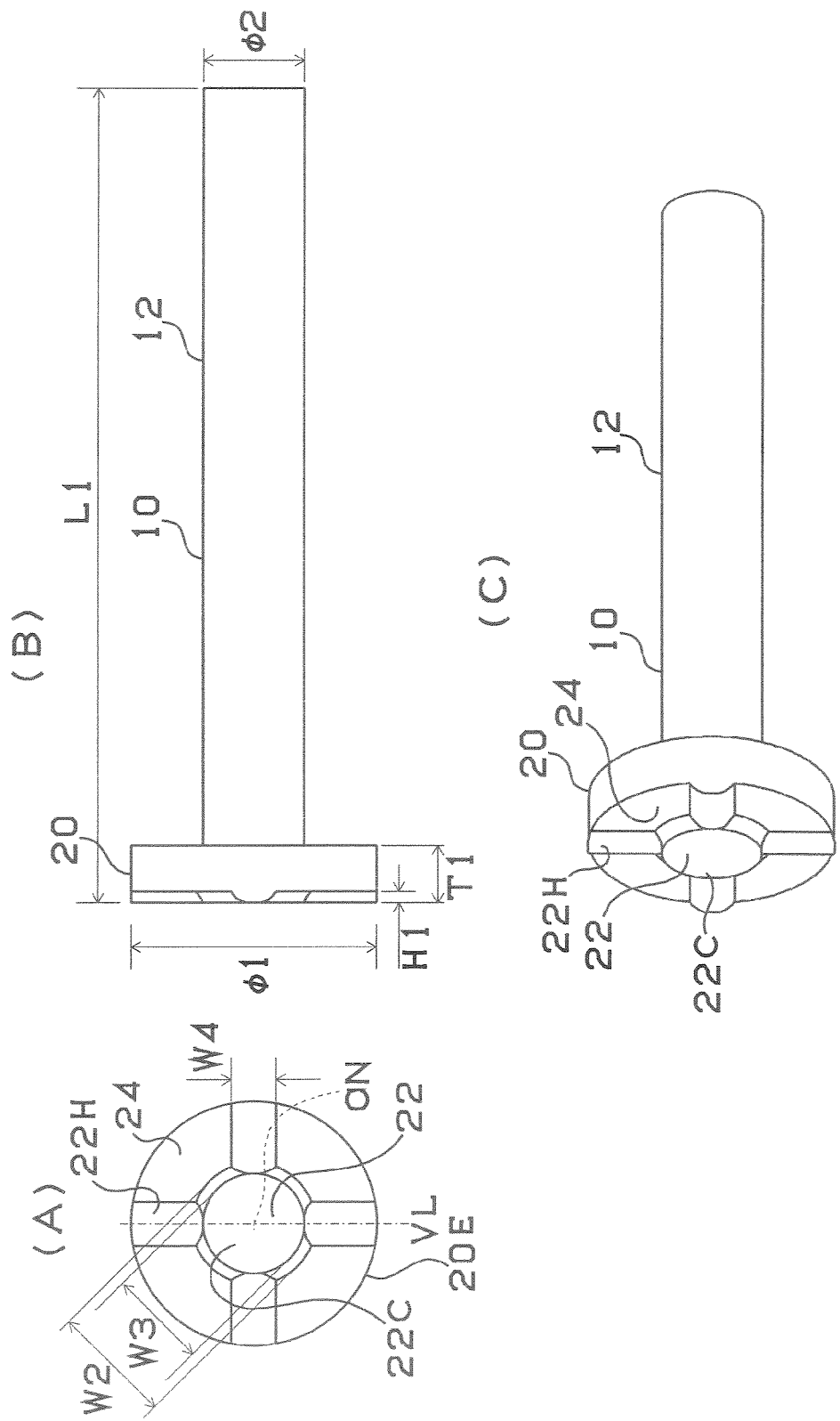
FIG. 5 is a plan view of the semiconductor loading lead pin according to the second embodiment.

Hereinafter, the semiconductor loading lead pin according to the second embodiment of the present invention will be described with reference to FIGS. 5-7.

FIG. 5(A) is a plan view of the semiconductor loading lead pin according to the second embodiment, FIG. 5(B) is a side view thereof and FIG. 5(C) is a perspective view thereof.

The semiconductor loading lead pin 10 is comprised of a cylindrical shaft 12 and a flange 20. The flange 20 is constituted of a plane-like flat portion 22 which can make contact with the electrode pad of the package board and four groove portions 24 which are dented from the flat portion 22. The flat portion 22 is comprised of a circular portion 22C coaxial with the flange 20 and an extending portion 22H having a semi-circular section which extends from the circular portion 22C toward the side end 20E with its top end (surface position) located at the same height as the circular portion 22C. The flat portion 22 is formed symmetrically to the normal VL passing through the center CN of the shaft 12 and the highest position of the extending portion 22H. The groove portion 24 is formed to be directed to the central side from the side end 20E.

Here, the semiconductor loading lead pin is manufactured of copper alloy or the like in its entire length L1 of 3.16 mm. The diameter Φ2 of the shaft 12 is 0.45 mm. The diameter Φ1 of the flange 20 is 1.1 mm and the thickness T1 is 0.26 mm. The depth H1 of the groove portion 24 is 0.05 mm. As shown in FIG. 1(A), the diameter W3 of the top end of the circular portion 22C is 0.45 mm and the diameter W2 of the bottom end is 0.55 mm. The width W4 of the extending portion 22H is set to 0.2 mm.

Because in the semiconductor loading lead pin 10 of the second embodiment, the void B expanded in the solder escapes sideway along the groove portion 24 when reflow is carried out to load the IC chip like the first embodiment, it does not happen that the flange 20 is lifted by the void B so that the semiconductor loading lead pin 10 is tilted.

Further, in the semiconductor loading lead pin 10 of the second embodiment, the flat portion 22 is comprised of the circular portion 22C coaxial with the flange 20 and the extending portion 22H having a semi-circular section, which extends from the circular portion 22 to its side end with its top end located at the same height as the circular portion 22C. Thus, the flat portion 22 can be formed easily with a mold.

Because the extending portion 22H of the flat portion 22 extends from the central position of the flange 20 up to the side end 20E and is formed symmetrically with respect to the normal VL passing through the center of the shaft 12, the semiconductor loading lead pin 10 can maintain its perpendicularity to the package board 40 when the solder paste 48-*a* for connection is melted at the time of reflow to load the IC chip.

Figure 6:
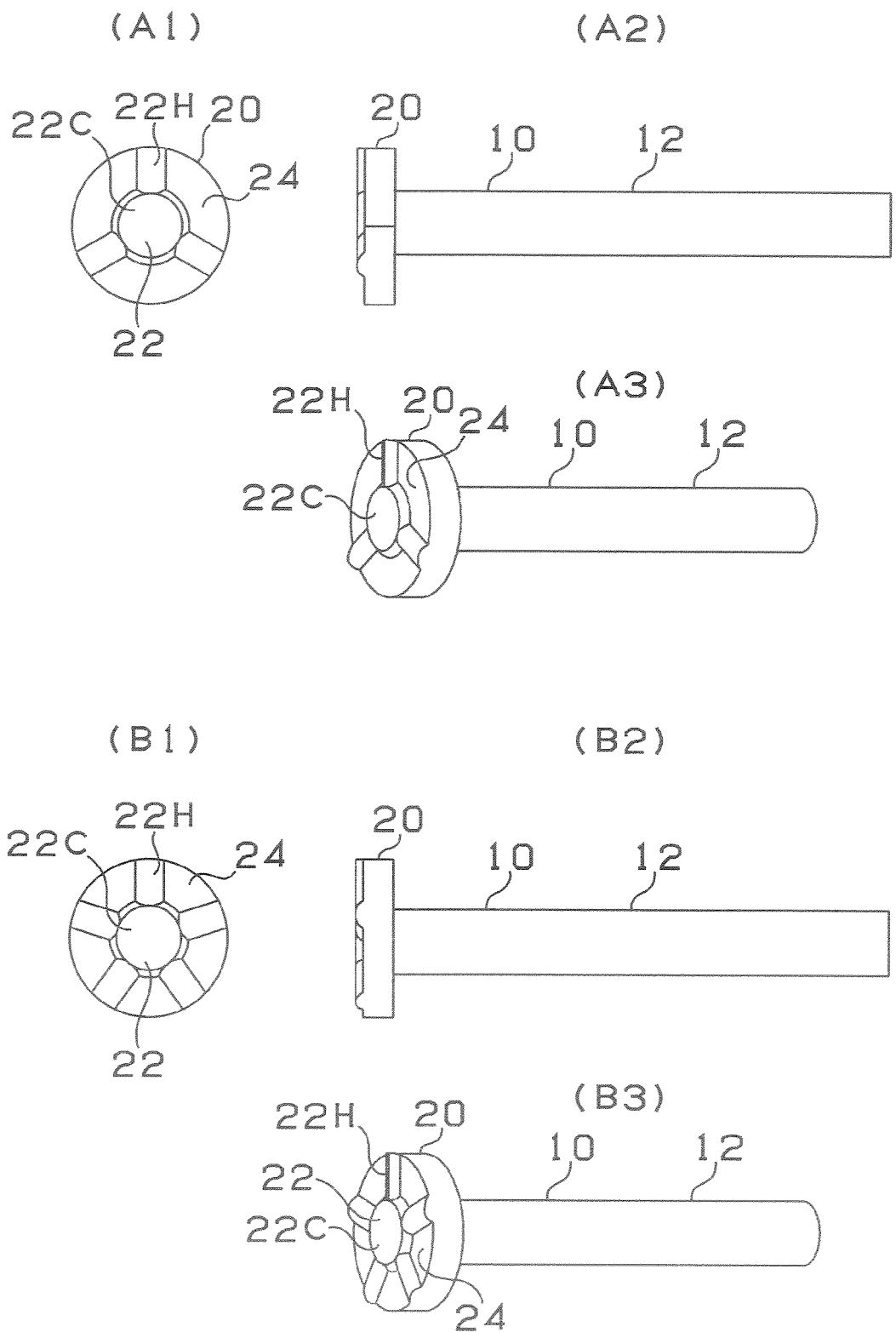
FIG. 6(A1) is a plan view of the semiconductor loading lead pin according to a first modification of the second embodiment, FIG. 6(A2) is a side view thereof and FIG. 6(A3) is a perspective view thereof.

FIG. 6(A1) is a plan view of the semiconductor loading lead pin according to a first modification of the second embodiment, FIG. 6(A2) is a side view thereof and FIG. 6(A3) is a perspective view thereof. FIG. 6(B1) is a plan view of the semiconductor loading lead pin according to a second modification of the second embodiment, FIG. 6(B2) is a side view thereof and FIG. 6(B3) is a perspective view thereof.

The semiconductor loading lead pin 10 of the second embodiment described with reference to FIG. 5 includes four groove portions 24 in its flange 20. Instead, three groove portions may be provided as shown in FIG. 4(A1), FIG. 6(A2) and FIG. 6(A3) and five groove portions may be provided as shown in FIG. 6(B1), FIG. 6(B2) and FIG. 6(B3).

FIG. 7(A) is a perspective view of the semiconductor loading lead pin according to a third modification of the second embodiment, FIG. 7(B) is a perspective view of the semiconductor loading lead pin according to a fourth modification and FIG. 7(C) is a perspective view of the semiconductor loading lead pin according to a sixth modification.

In the second embodiment described above with reference to FIG. 5 and in the first modification, second modification and third modification of the second embodiment described with reference to FIG. 6, the extending portion 22H is formed semi-circularly in its section. Contrary to this as shown in FIGS. 7(A), 7(B) and 7(C), it is preferable to provide a linear flat face 22F on the topmost portion of the extending portion 22H.

Third Embodiment

Figure 8:
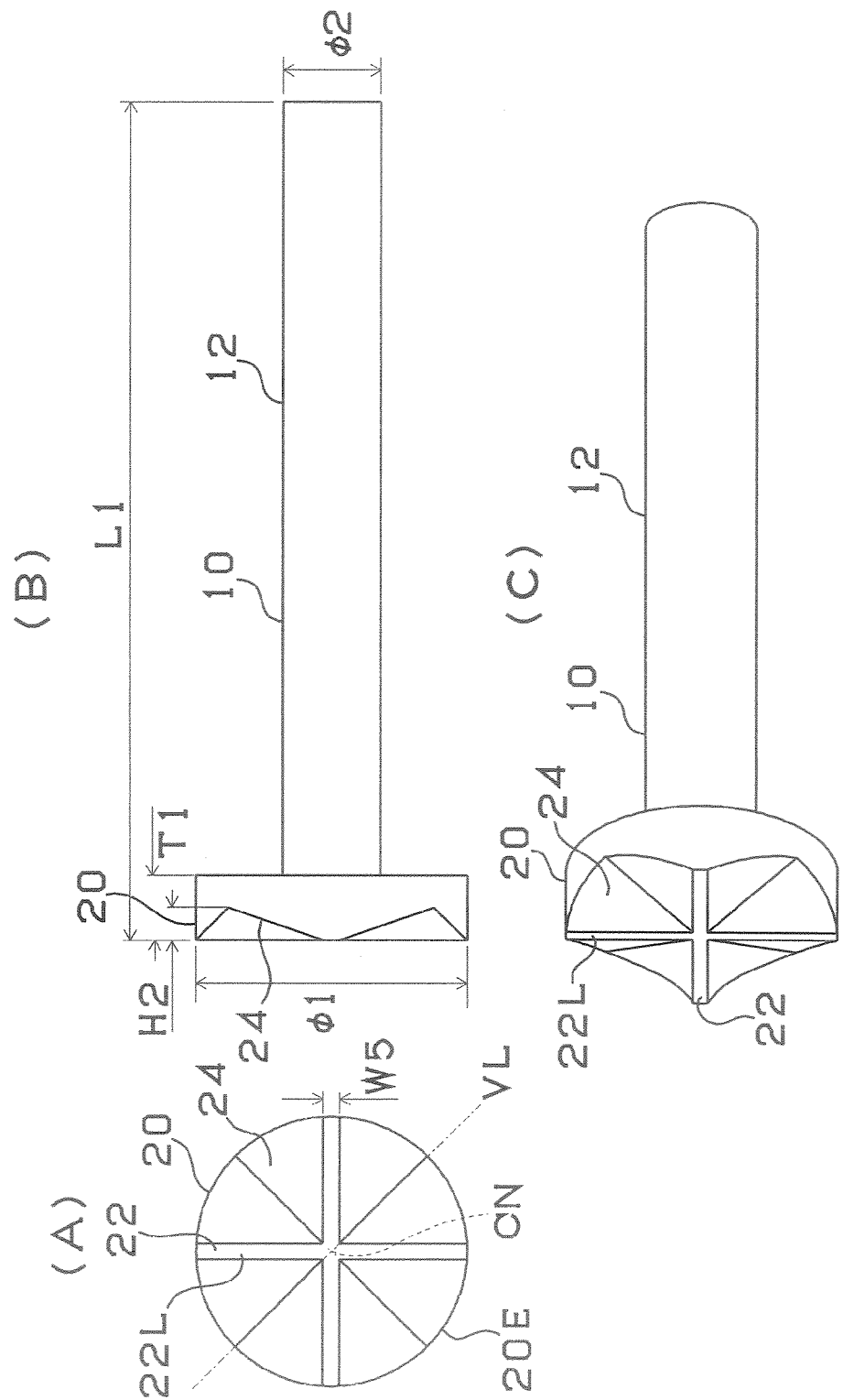
FIG. 8(A) is a plan view of the semiconductor loading lead pin according to a third embodiment.
FIG. 8(B) is a side view thereof and FIG. 8(C) is a perspective view thereof.

Hereinafter, the semiconductor loading lead pin according to the third embodiment of the present invention will be described with reference to FIGS. 8, 9.

FIG. 8(A) is a plan view of the semiconductor loading lead pin according to the third embodiment, FIG. 8(B) is a side view thereof and FIG. 8(C) is a perspective view thereof.

The semiconductor loading lead pin 10 is comprised of the cylindrical shaft 12 and the flange 20. The flange 20 is constituted of the plane-like flat portion 22 which can make contact with the electrode pad of the package board and the four groove portions 24 which are dented in a V shape from the flat portion 22. The flat portion 22 is constituted of the linear extending portion 22L which extends in the shape of cross from the center CN of the flange toward the side end 20E. The flat portion 22 is formed symmetrically with respect to the normal VL which passes through the center CN of the shaft 12 and the deepest position of the groove portion 24. The groove portion 24 is formed to be directed to the center side from the side end 20E.

Here, the semiconductor loading lead pin is manufactured of copper alloy or the like in its entire length L1 of 3.16 mm. The diameter Φ2 of the shaft 12 is 0.46 mm. The diameter Φ1 of the flange 20 is 1.1 mm and the thickness T1 is 0.26 mm. The groove portion 24 is formed in the depth H2 of 0.13 mm at the side end 20E which is the deepest. As shown in FIG. 1(A), the width W5 of the linear extending portion 22L is set to 0.05 mm.

Because in the semiconductor loading lead pin 10 of the third embodiment the void expanded in the solder escapes sideway along the groove portion when reflow is carried out to load the IC chip like the first embodiment, it does not happen that the flange 20 is lifted by the void B so that the semiconductor loading lead pin 10 is tilted.

Because in the semiconductor loading lead pin 10 of the third embodiment the groove portion 24 is formed in a substantially V shape and tilted to the side end 20E of the flange 20, the expanded void is likely to escape along the groove portion 24 at the time of reflow. Even if the void does not leave the solder 48, it spreads along the groove portion 24 so that the semiconductor loading lead pin 10 is not tilted.

Further because the flat portion 22 extends from the central position of the flange 20 up to the side end 20E and is formed symmetrically with respect to the normal VL passing through the center of the shaft 12, the semiconductor loading lead pin 10 can maintain its perpendicularity to the package board 40 when the solder 48 for connection is melted at the time of reflow for loading an IC chip.

FIG. 9(A1) is a plan view of the semiconductor loading lead pin according to a first modification of the third embodiment, FIG. 9(A2) is a side view thereof and FIG. 9(A3) is a perspective view thereof. FIG. 9(B1) is a plan view of the semiconductor loading lead pin according to a second modification of the third embodiment, FIG. 9(B2) is a side view thereof and FIG. 9(B3) is a perspective view thereof.

The semiconductor loading lead pin 10 of the third embodiment described with reference to FIG. 8 has four groove portions 24 in its flange 20. Instead, three groove portions may be provided as shown in FIG. 9(A1), FIG. 9(A2), FIG. 9(A3) or five or more as shown in FIG. 9(B1), FIG. 9(B2) FIG. 9(B3).

Evaluation Test

Here, the result of a test made by changing the depth H1 of the groove portion 24 of the semiconductor loading lead pin of the first embodiment will be described. Six pieces (psc) of the package boards having 360 semiconductor loading lead pins were manufactured and whether or not the semiconductor loading lead pin was tilted was investigated. As a comparative example, semiconductor loading lead pins each having the flat flange 20 were attached to the package board as shown in FIG. 10. Pb—Sn—Sb solder having a melting point of 230° C. was used for the solder bump for connecting the IC chip and Pb82-Sn10-Sb8 solder having a melting point of 236° C. was used as solder for fixing the semiconductor loading lead pin.

When the depth H1 was set to 0.04 mm, the tilt of the semiconductor loading lead pin was observed in two package boards of six package boards like the comparative example using the semiconductor loading lead pin of the conventional art. When the depth H1 was set to 0.05 mm, tilt of the semiconductor loading lead pin was generated. As a result of this, it was evident that the depth H1 was preferred to be set to 0.05 mm or more.

To the contrary, when the depth was set to 2.1 mm, the tilt of the semiconductor loading lead pin was observed in a package board. When the depth H1 was set to 2 mm, no tilt was generated in the semiconductor loading lead pin. As a result of this, it was evident that the depth H1 was preferred to be set to 2 mm or less.

Further, a test was made regarding the ratio between the area of the flat portion and the sectional area in the vertical direction of the shaft of the flange.

This result is shown in a table of FIG. 11.

When the area of the flat portion was 50%, namely the groove portion was 50% a tilt of the semiconductor loading lead pin was observed in a package board when 40 seconds pass at 240° C. That is, it was evident that there was an effect if the ratio was 50% or less. From viewpoint of margin of process at the time of installation, it was evident that it was preferred to be set to 30% or less.

To the contrary, when the area of the flat portion was set to 4%, a predetermined pull resistance (4.5 Kgf) could not be obtained and when it was set to 5%, the predetermined pull resistance was obtained. It was made evident that even if it was set to 10% or more, the pull resistance was not raised. Consequently, it was made evident that it could be connected to a connection pad firmly when the area of the flat portion was set to 5% or more.

The measurement method of the pull resistance is the same as the measurement method of joint strength described in the Japanese Patent Application Laid-Open No. 2001-267451.

This evaluation test was made about the semiconductor loading lead pin of the first embodiment and it is considered that the same result is obtained in the semiconductor loading lead pin of the second embodiment and the semiconductor loading lead pin of the third embodiment.

INDUSTRIAL APPLICABILITY

The flat portion and groove portion having each specific shape have been described in the first-third embodiments and needless to say, the flat portion and groove portion having a variety of shapes can be obtained if the void can escape sideway by providing the grooves.

What is claimed is:

1. A lead pin comprising:
   a body having a shaft portion and a flange portion,
   wherein the flange portion has at least one flat portion configured to face a connection pad and a plurality of groove portions positioned to face toward the connection pad and extending from a peripheral portion toward a center portion of the flange portion, the flat portion comprises a plurality of linear extending portions extending from a center of the flange toward the peripheral portion of the flange and connected at the center of the flange, and the groove portions are tilted to become deeper toward the peripheral portion of the flange.

2. The lead pin according to claim 1, wherein each of the groove portions is formed in a substantially V shape in cross section.

3. The lead pin according to claim 1, wherein the flat portion has an area which is 5-50% of the flange.

4. The lead pin according to claim 3, wherein the flat portion has an area which is at least 10% of the flange.

5. The lead pin according to claim 3, wherein the flat portion has an area which is at most 30% of the flange.

6. The lead pin according to claim 1, wherein the flat portion has an area which is 10-30% of the flange.

7. The lead pin according to claim 1, wherein the flat portion has an area which is at least 10% of the flange.

8. The lead pin according to claim 1, wherein the flat portion has an area which is at most 30% of the flange.

9. A printed wiring board comprising:
   a connection pad; and
   a lead pin having a shaft portion and a flange portion, wherein the flange portion has at least one flat portion configured to face a connection pad and a plurality of groove portions configured to face toward the connection pad and extending from a peripheral portion toward a center portion of the flange portion, the flat portion comprises a plurality of linear extending portions extending from a center of the flange toward the peripheral portion of the flange and connected at the center of the flange, and the groove portions are tilted to become deeper toward the peripheral portion of the flange.

10. The printed wiring board according to claim 9, wherein each of the groove portions is formed in a substantially V shape in cross section.

11. The printed wiring board according to claim 10, wherein the flat portion has an area which is 5-50% of the flange.

12. The printed wiring board according to claim 10, wherein the flat portion has an area which is 10-30% of the flange.

13. The printed wiring board according to claim 9, wherein the flat portion has an area which is 5-50% of the flange.

14. The printed wiring board according to claim 13, wherein the flat portion has an area which is at least 10% of the flange.

15. The printed wiring board according to claim 13, wherein the flat portion has an area which is at most 30% of the flange.

16. The printed wiring board according to claim 9, wherein the flat portion has an area which is 10-30% of the flange.

17. The printed wiring board according to claim 9, wherein the flat portion has an area which is at least 10% of the flange.

18. The printed wiring board according to claim 9, wherein the flat portion has an area which is at most 30% of the flange.

* * * * *